United States Patent
Campbell

(10) Patent No.: US 7,218,562 B2
(45) Date of Patent: May 15, 2007

(54) RECOVERING BIT LINES IN A MEMORY ARRAY AFTER STOPPED CLOCK OPERATION

(75) Inventor: Brian J. Campbell, Sunnyvale, CA (US)

(73) Assignee: P.A. Semi, Inc., Santa Clara, CA (US)

( * ) Notice: Subject to any disclaimer, the term of this patent is extended or adjusted under 35 U.S.C. 154(b) by 147 days.

(21) Appl. No.: 11/173,119

(22) Filed: Jul. 1, 2005

(65) Prior Publication Data
US 2007/0002650 A1   Jan. 4, 2007

(51) Int. Cl.
*G11C 7/00*   (2006.01)

(52) U.S. Cl. .................. 365/203; 365/149; 365/233; 365/229; 712/39; 712/43; 712/229

(58) Field of Classification Search ............... 365/203, 365/149, 233, 229; 712/39, 43, 229
See application file for complete search history.

(56) References Cited

U.S. PATENT DOCUMENTS

| | | | |
|---|---|---|---|
| 5,434,822 A | * | 7/1995 | Deleganes et al. .......... 365/203 |
| 5,642,324 A | * | 6/1997 | Ghosh et al. .......... 365/230.03 |
| 6,041,401 A | | 3/2000 | Ramsey et al. |
| 6,084,454 A | * | 7/2000 | Holst .......................... 327/198 |
| 7,046,573 B2 | * | 5/2006 | Takazawa et al. .......... 365/229 |
| 7,082,069 B2 | | 7/2006 | Chou et al. |
| 7,126,867 B2 | | 10/2006 | Kang et al. |

* cited by examiner

*Primary Examiner*—Son Dinh
*Assistant Examiner*—Eric J. Wendler
(74) *Attorney, Agent, or Firm*—Lawrence J. Merkel; Meyertons, Hood, Kivlin, Kowert & Goetzel, P.c.

(57) ABSTRACT

In one embodiment, an apparatus comprises a plurality of memory cells; first and second bit lines coupled to the plurality of memory cells; a first and second bit line precharge circuits coupled to the first and second bit lines; and a control circuit coupled to the first and second bit line precharge circuits. The first and second bit line precharge circuits are each configured to precharge the first bit line and the second bit line. The control circuit is coupled to receive an indication that one or more clocks are being restarted after a period of stopped clock operation, and is configured to activate both the first and second bit line precharge circuits responsive to the indication and independent of an operation to the memory that was interrupted by the period of stopped clock operation, if any.

13 Claims, 3 Drawing Sheets

RECOVERING BIT LINES IN A MEMORY ARRAY AFTER STOPPED CLOCK OPERATION

BACKGROUND

1. Field of the Invention

This invention is related to the field of integrated circuits and, more specifically, to recovering bit lines in a memory array.

2. Description of the Related Art

Integrated circuits may include embedded memory such as static random access memory (SRAM). Some integrated circuits may include only SRAM (e.g. SRAM chips designed for attachment to a circuit board with other integrated circuits). Other integrated circuits may include SRAM to store data used by logic circuitry also integrated into the integrated circuit.

Typical SRAM memory arrays include a plurality of memory cells coupled to a pair of bit lines used to access the memory cells. Generally, the bit lines are precharged (e.g. to the supply voltage) to prepare for a read/write operation. Multiple sets of memory cells coupled to different pairs of bit lines are used to provide a multiple bit input/output "word" of the memory array.

A read operation typically includes selecting one of the memory cells to output its stored bit, and the selected memory cell discharging one of the pair of bit lines based on the value of the bit stored in the memory cell. A sense amplifier (senseamp) circuit senses the differential between the voltages on the bit lines and amplifies the differential to output the bit from the memory array (either as a single bit or a differential pair with full signal swing). The memory array is designed such that the bit line is not fully discharged for a read operation. Subsequent to the senseamp sensing the bit lines, the bit lines are precharged to prepare for the next operation.

A write operation typically includes selecting one of the memory cells to be written, and driving the bit lines to write the bit into the selected memory cell. Since the bit lines are precharged prior to the start of the write operation, one of the bit lines is discharged based on the bit being written. Typically, the bit line is fully discharged (or almost fully discharged) for a write operation. The bit lines are subsequently precharged again to prepare for the next operation.

Since the discharge of a bit line for a read operation differs from that of a write operation, the current capability of the precharge circuits for each operation may differ. For most memory arrays, a large number of bit line pairs are present and thus the precharge control signals that cause the precharge drive a large number of precharge circuits. The capacitive load on the precharge control signals is proportional to the current capability of the precharge circuits, and thus the power dissipated in driving the precharge control signals is also proportional to the current capability. Accordingly, many memory arrays provide two precharge circuits for each bit line. One of the precharge circuits is designed to precharge the bit lines after a read operation, and thus has a relatively low current capability since the circuit need not be able to precharge all the way from ground to the supply voltage. Thus, less power is dissipated when a read operation is performed. Both precharge circuits are activated after a write operation, and the combination is designed to precharge a fully discharged bit line (e.g. from ground to the supply voltage).

Additionally, many integrated circuits may permit the clock or clocks in the integrated circuit to be stopped for a period of time without loss of state. For example, the clocks may be stopped for test purposes (e.g. to read the state of the integrated circuit or to change the state). The clocks may also be stopped for power management purposes.

While stopping the clocks is supposed to avoid a loss of state, if the clocks are stopped during a read operation prior to a precharge, the bit line may continue to discharge. If the clock is stopped for long enough, the bit line may discharge to a voltage that is lower than the precharge circuit is able to recover. When the clock starts again, the state of the integrated circuit indicates that a read was in progress and the read precharge circuit is activated. An incomplete precharge may thus occur.

SUMMARY

In one embodiment, an apparatus comprises a plurality of memory cells; first and second bit lines coupled to the plurality of memory cells; a first and second bit line precharge circuits coupled to the first and second bit lines; and a control circuit coupled to the first and second bit line precharge circuits. The first and second bit line precharge circuits are each configured to precharge the first bit line and the second bit line. The control circuit is coupled to receive an indication that one or more clocks are being restarted after a period of stopped clock operation, and is configured to activate both the first and second bit line precharge circuits responsive to the indication and independent of an operation to the memory that was interrupted by the period of stopped clock operation, if any.

In another embodiment, the apparatus comprises a plurality of memory cells; first and second bit lines coupled to the plurality of memory cells; a first and second bit line precharge circuits coupled to the first and second bit lines; and a control circuit coupled to the first and second bit line precharge circuits. The first bit line precharge circuit is configured to precharge the first and second bit lines responsive to a read operation to one of the plurality of memory cells. The control circuit is coupled to receive an indication that a period of stopped clock operation is ending, and is configured to activate at least the second bit line precharge circuit responsive to the indication and even if a read operation was in progress at a start of the period of stopped clock operation.

In yet another embodiment, a method comprises ending a period of stopped clock operation; and activating both a first bit line precharge circuit and a second bit line precharge circuit to precharge a first bit line and a second bit line to which the first bit line precharge circuit is coupled and to which the second bit line precharge circuit is coupled responsive to the end of the period and independent of an operation that was interrupted at a start of the period of stopped clock operation, if any.

BRIEF DESCRIPTION OF THE DRAWINGS

The following detailed description makes reference to the accompanying drawings, which are now briefly described.

Figure 1:
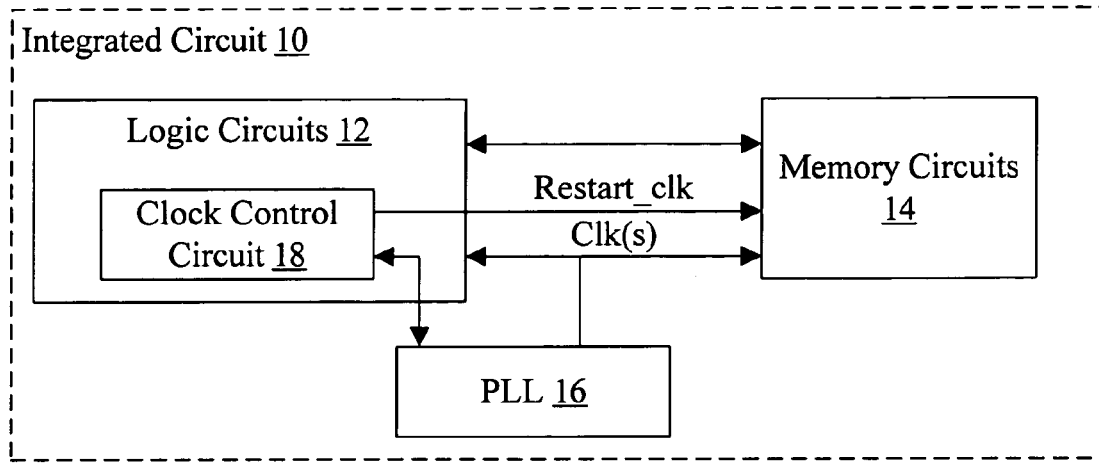
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram of one embodiment of an integrated circuit 10 is shown. In the illustrated embodiment, the integrated circuit 10 includes a plurality of logic circuits 12, a plurality of memory circuits 14, and a phase locked loop (PLL) 16. The logic circuits 12 are coupled to the memory circuits 14, and the PLL 16 is coupled to provide one or more clocks to the logic circuits 12 and the memory circuits 14. The logic circuits 12 include a clock control circuit 18 configured to control the clock generation by the PLL 16. The clock control circuit 18 is coupled to the PLL 16 and to provide a restart clock signal (Restart_clk in FIG. 1) to the memory circuits 14. The integrated circuit 10 may generally comprise the logic circuits 12 and the memory circuits 14 integrated onto a single semiconductor substrate (or chip).

The logic circuits 12 may generally implement the operation for which the integrated circuit 10 is designed. The logic circuits 12 may generate various values during operation, which the logic circuits 12 may store in the memory circuits 14. Additionally, the logic circuits 12 may read various values from the memory circuits 14 on which to operate. For example, in various embodiments, the memory circuits 14 may include memory used for caches, register files, integrated-circuit-specific data structures, etc. The memory circuits 14 may implement any type of readable/writeable memory. In an example below, an SRAM memory will be used.

Generally, if a logic circuit 12 is to access a memory circuit 14, the logic circuit 12 may generate various control signals to the memory circuit 14. For example, the control signals may include an address identifying the memory location in the memory circuit 14 that is to be accessed, a read enable signal which may be asserted to perform a read operation, and a write enable signal which may be asserted to perform a write operation. For a read operation, the memory circuit 14 may output data to the logic circuit 12. For a write operation, the logic circuit 12 may supply data to the memory circuit 14 for storage.

The clock control circuit 18 may generally be configured to control operation of the PLL 16 for clock generation in the integrated circuit 10. The PLL 16 may be configured to generate one or more clocks used to clock the logic circuits 12 and the memory circuits 14. If more than one clock is generated, the clocks may be of different frequencies, different phases, or both. The clock control circuit 18 may control the generation of clocks for any purpose, including test and power management purposes. Generally, the clock control circuit 18 may program the PLL 16 with the desired frequency or frequencies of clocks, and may enable/disable clock generation.

In particular, the clock control circuit 18 may control the PLL 16 to cause a period of stopped clock operation. A period of stopped clock operation comprises a period of time in which the clock(s) generated by the PLL 16 do not oscillate. The clocks may be held steady at a high or low value during the period, in various embodiments. The clocks control the synchronous capture and launch of integrated circuit state in various storage devices including the memory circuits 14 and clocked storage devices such as register, flops, latches, etc. Since the clocks are stopped, the integrated circuit state is frozen at the state existing at the time the clock stopped. When the period of stopped clock operation ends, operation of the integrated circuit 12 continues from the frozen state. As long as the supply voltage to the integrated circuit is maintained, the state may not be lost.

The period of stopped clock operation may be used for a variety of purposes. For example, to test the integrated circuit 10 (either during manufacturing or, in some cases, in the field), the clocks may be stopped to scan state into or out of the integrated circuit 10 for diagnostic purposes. Additionally, certain power management states may include stopping the clocks. For example, so-called "sleep" states in which the integrated circuit 10, or portions of the integrated circuit 10, are inactive and not clocked may comprise periods of stopped clock operation.

If a memory circuit 14 is in the process of performing a read operation at the time that stopped clock operation starts, it is possible that the bit lines may continue to discharge during the stopped clock operation. For example, if the read operation is frozen while a word line is still active to the selected memory cell, the selected memory cell may continue to discharge one of the bit lines based on the stored bit. Alternatively, leakage of the charge on the bit lines may cause the bit lines to discharge during stopped clock operation (whether the memory circuit 14 is in the process of performing a read operation or not). If a bit line is discharged "too far" (that is, to a voltage below the level that the read precharge circuit is designed to recover), the precharge circuit normally activated for reads may not provide enough precharge to restore the bit line to the supply voltage level. The precharge normally provided after a read is referred to herein as a read precharge. Since the state of the integrated circuit 10 includes state indicating that a read was in progress, when the period of stopped clock operation ends, the read precharge would normally be all that is provided.

The clock control circuit 18 may provide the restart clock signal to the memory circuits 14, and may assert the restart clock signal to indicate that the clocks from the PLL 16 are being restarted after a period of stopped clock operation. That is, the restart clock signal may indicate that the period of stopped clock operation is ending. In some embodiments, the clock control circuit 18 may assert the restart clock signal any time that a period of stopped clock operation is ending. In other embodiments, the clock control circuit 18 may assert the restart clock signal if the period of stopped clock operation is long enough that a read precharge may not be sufficient to precharge the bit lines fully. In some embodiments, the clocks may be restarted at a variety of frequencies, some of which may be low enough that the read precharge may be sufficient to precharge the bit lines fully from ground to the supply voltage. In such embodiments, the clock control circuit 18 may assert the restart clock signal if the frequency at which the clocks are being restarted is high enough that the read precharge may not be sufficient to fully precharge the bit lines.

The memory circuits 14 may include precharge control circuits that may control the precharge of the bit lines in the memory arrays. The precharge control circuits may receive the restart clock signal from the clock control circuit 18, and may activate at least the precharge circuit that is activated for write operations in response to an assertion of the restart clock signal. In one embodiment, the precharge control circuit may cause both precharge circuits on each bit line to activate in response to an assertion of the restart clock signal. The precharge control circuits may activate the precharge circuits as if a write has occurred (perform a "write precharge") even if a read operation was interrupted by the period of stopped clock operation. In some embodiments, the precharge control circuits may perform a write precharge independent of whether or not any operation was interrupted, and/or independent of which type of operation was interrupted (read or write).

Figure 2:
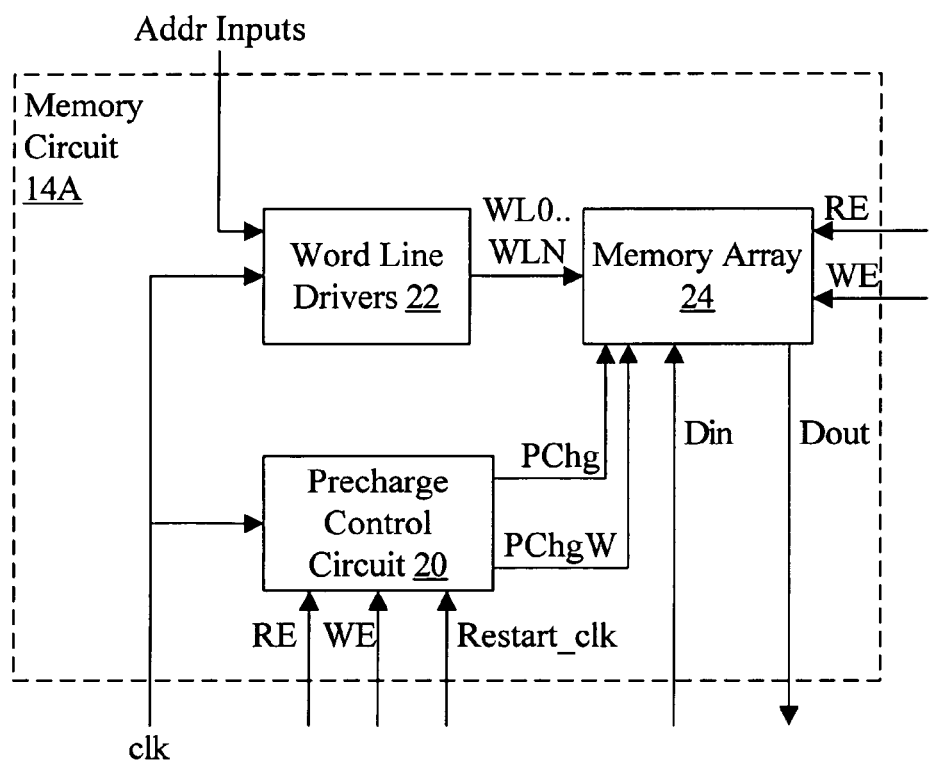
FIG. 2 is a block diagram of one embodiment of a memory circuit shown in FIG. 1.

Turning now to FIG. 2, a block diagram of one embodiment of a memory circuit 14A is shown. The memory circuit 14A may be one of the memory circuits 14. Other memory circuits 14 may be similar. In the embodiment of FIG. 2, the memory circuit 14A includes a precharge control circuit 20, a set of word line driver circuits 22, and a memory array 24. Other circuitry may be included (e.g. clock gater circuitry, if clock gating is implemented, other control signal generation circuitry, etc.). The precharge control circuit 20 and the word line drivers 22 are coupled to receive a clock input (clk). The word line drivers 22 are further coupled to receive one or more address inputs (Addr inputs) from the logic circuits 12 (and may also receive an enable input indicating whether or not a read/write operation is being attempted, not shown in FIG. 2). The word line drivers 22 are configured to generate a set of word lines to the memory array 24 (WL0 . . . WLN). The memory array 24 is further coupled to receive data (Din) and provide data (Dout) to/from the logic circuits 12. Still further, the memory array 24 is coupled to receive a write enable (WE) signal and a read enable (RE) signal. The WE signal may be asserted for write operations, and the RE signal may be asserted for read operations. The precharge control signal is coupled to receive the WE and RE signals and the restart clock signal, and is configured to generate precharge control signals to the memory array 24. Particularly, the precharge control circuit 20 may generate a precharge (PChg) signal and a precharge write (PChgW) signal.

The precharge control circuit 20 may generate the PChg and PChgW signals responsive to the clock signal, the RE signal, the WE signal, and the restart clock signal. The precharge control circuit 20 may use the clock signal to determine when to perform the precharge. Generally, the memory array 24 may have an access phase and a precharge phase, based on the clock signal. In the access phase, the read/write operation may be performed (e.g. the word line may be activated and the bit lines driven (for a write) or sensed (for a read)). In the precharge phase, the bit lines may be precharged to prepare for the next read/write operation. The RE and WE signals may indicate if a read or write operation is being performed. If a read operation is performed, the precharge control circuit 20 may assert the PChg signal during the precharge phase. If a write operation is performed, the precharge control circuit 20 may assert at least the PChgW signal. In one embodiment, the precharge control circuit 20 may assert both the PChgW signal and the PChg signal if a write operation is performed. If the restart clock signal is asserted, the precharge control circuit 20 may assert at least the PChgW signal, and may assert both the PChgW and PChg signals, in one embodiment. That is, the precharge control circuit 20 may respond to the restart clock signal with a write precharge independent of whether or not an operation was interrupted by stopped clock operation. The precharge control circuit 20 may perform a write precharge even if a read operation was interrupted by the stopped clock operation.

Figure 3:
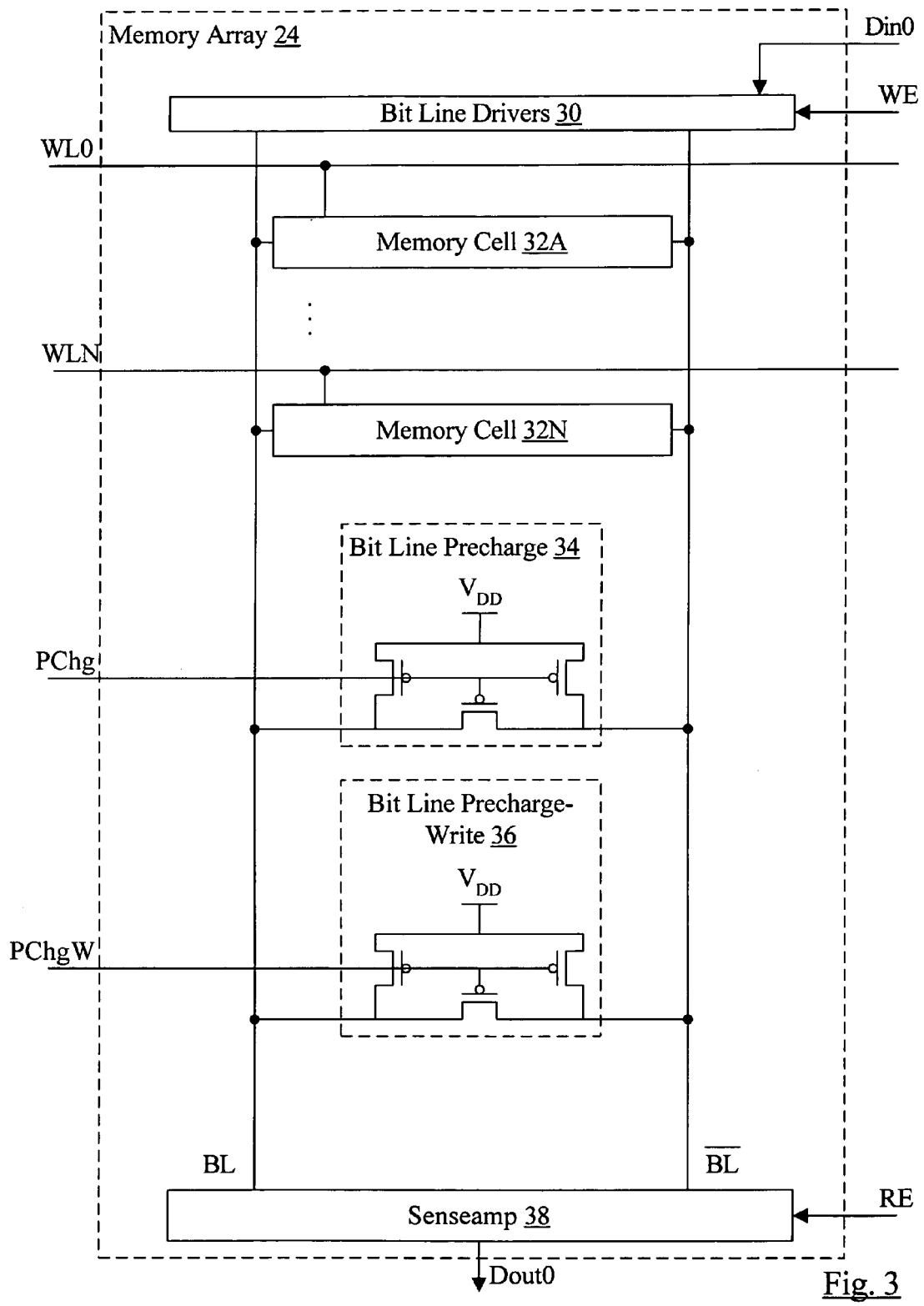
FIG. 3 is a circuit diagram of one embodiment of a memory array shown in FIG. 2.

In one embodiment, each of the PChg and PChgW signals is coupled to a set of precharge circuits that are coupled to the bit lines in the memory array 24. One implementation of the precharge circuits is shown in FIG. 3. In one implementation, the PChg and PChgW signals activate p-type metal-oxide-semiconductor (PMOS) transistors in the precharge circuits, and thus the PChg and PChgW signals may be asserted low.

The memory array 24 may comprise a plurality of memory cells. Each memory cell is activated for access (read or write) by one of the word lines WL0 . . . WLN coupled to that memory cell. One or more memory cells coupled to the same word line form a "word" for access in the memory array 24. That is, the bits of the word may be read/written as a group. The width of the word may thus be the width of the Din and Dout signals from the memory array 24.

The word line drivers 22 activate a given word line based on address inputs from the logic circuits 12. The address identifies the word in the memory array 24 to be accessed for a given access generated by the logic circuits 12. In some embodiments, the logic circuits 12 may include circuits that partially or fully decode the address, and the address inputs may be the partially or fully decoded address. Alternatively, the word line drivers 22 may implement the full decode function and the address inputs may encode the address. Generally, each different address causes a different word line WL0 to WLN to be asserted.

Turning now to FIG. 3, a circuit diagram of a portion of one embodiment of the memory array 24 is shown. The portion shown in FIG. 3 may correspond to bit 0 of the Din and Dout signals (shown as Din0 and Dout1, respectively, in FIG. 3). Other portions similar to the portion shown in FIG. 3 may be implemented for other bits in the Din/Dout word. In embodiments which implement banks, other portions may implement the bits of the Din/Dout word for other banks. In the embodiment of FIG. 3, the memory array 24 includes bit line driver circuits 30, memory cells 32A–32N, a bit line precharge circuit 34, a bit line precharge-write circuit 36, and a senseamp 38. The bit line drivers 30, the memory cells 32A–32N, the bit line precharge circuit 34, the bit line hold circuit 36, and the senseamp 38 are coupled to a pair of bit lines (BL and BL bar, the latter labeled as BL with a bar over it in FIG. 3). The memory cell 32A is coupled to word line WL0, and the memory cell 32N is coupled to the word line WLN. Other memory cells, not explicitly shown in FIG. 3 but indicated by the ellipses between the memory cells 32A and 32N, are coupled to other word lines. The bit line precharge circuit 34 is coupled to the PChg signal. The bit line precharge-write circuit 36 is coupled to the PChgW signal. The bit line drivers 30 are coupled to receive the Din0 signal and the write enable (WE) signal. The senseamp 38 is coupled to the Dout1 signal and the read enable (RE) signal.

Each of the memory cells 32A–32N may comprise an SRAM memory cell, in one embodiment. For example, each memory cell 32A–32N may include cross-coupled inverters that hold the bit stored in the memory cell 32A–32N, and transistors that control connection of the cross-coupled inverters to the bit lines BL and BL bar. The gates of the transistors are coupled to the word line signal (e.g. the WL0 signal for the memory cell 32A or the WLN signal for the memory cell 32N). Any number of memory cells 32A–32N may be included in various embodiments. While the memory cells 32A–32M may be a CMOS SRAM cell, other memory cells may be used in other embodiments. Generally, a memory cell may comprise circuitry configured to store a bit and configured to permit reading and writing of the bit.

Generally, the bit lines may be used to transfer a bit into and out of a memory cell 32A–32N that is activated using the corresponding word line. The bit lines represent the bit differentially, with BL being the true value of the bit and BL bar being the complement of the bit.

To perform a write operation, the bit line drivers 30 may be activated by asserting the WE signal. The bit line drivers 30 drive the Din0 bit on the BL line, and the complement of the Din0 bit on the BL bar line. One of the BL line or BL bar line is driven low by the bit line drivers 30. Generally, the bit line drivers 30 may drive the bit line substantially or completely to the ground voltage (e.g. completely discharging the bit line). Since the bit lines are precharged prior to the write operation being performed, the bit line drivers 30 may be configured to only drive one of the bit lines low. The other bit line may be held high by a bit line hold circuit coupled to the bit lines, which may pull up one bit line when the other bit line is discharged.

For read operations, the bit lines may be precharged prior to activating a memory cell 32A–32N via a corresponding word line (e.g. the precharge may be performed after the previous read/write operation). The activated memory cell 32A–32N discharges one of the bit lines based on the stored value of the memory cell, and the senseamp 38 detects the differential between the bit lines and amplifies the differential to produce the output bit Dout0. For read operations, the bit line being discharged may not be discharged all the way to the ground voltage. For example, in some implementations, a separation between the bit lines of about 100 millivolts may be sufficient for the senseamp 38 to detect the bit. Depending on operating frequency (of the clock signal(s) generated by the PLL 16), temperature, and manufacturing process variations, the amount of discharge that actually occurs may vary up to about ½ of the supply voltage to the integrated circuit 10 (often represented as $V_{DD}$).

The senseamp 38 may comprise any sense amplifier circuit that is coupled to receive a pair of bit lines and sense a differential between the pair to drive an output bit. In other embodiments, the senseamp 38 may output a differential pair of bits with full signal swing, amplified from the sensed differential on the bit lines (e.g. of about 100 millivolts under typical operation conditions, as mentioned above). The senseamp 38 in the illustrated embodiment is controlled by the RE signal.

The bit line precharge circuit 34 may precharge the bit lines responsive to the assertion (low) of the PChg signal. In the illustrated embodiment, the bit line precharge circuit 34 may comprise PMOS transistors having their gates coupled to the PChg signal. The PMOS transistors shown vertically in FIG. 3 may precharge the bit lines, and the horizontal PMOS transistor may provide balancing of the voltage on the bit lines. Other embodiments may implement different configurations.

The bit line precharge circuit 34 may be designed to provide sufficient precharge of the bit lines after a read operation has been performed. For example, in one embodiment, the bit line precharge circuit 34 may be configured to provide a precharge from about ½ of $V_{DD}$ up to the precharge voltage (e.g. the supply voltage, $V_{DD}$, or a voltage near $V_{DD}$) at the maximum clock frequency at which the integrated circuit 10 is designed to operate. The transistors in the bit line precharge circuit 34 may be sized to provide enough current for the desired precharge.

The bit line precharge-write circuit 36 may be designed to precharge the bit lines after a write operation. In one embodiment, the bit line precharge-write circuit 36 may be designed to fully precharge a bit line that has been driven low for a write operation. The bit line precharge-write circuit 36 may be designed to provide the precharge alone, or in concert with the operation of the bit line precharge circuit 34. The transistors in the bit line precharge-write circuit 36 may be sized to provide enough current for the desired precharge (in concert with the transistors in the bit line precharge circuit 34).

In the illustrated embodiment, the bit line precharge-write circuit 36 may include transistors in a similar configuration to the bit line precharge circuit 34. Other embodiments may implement other configurations.

Figure 4:
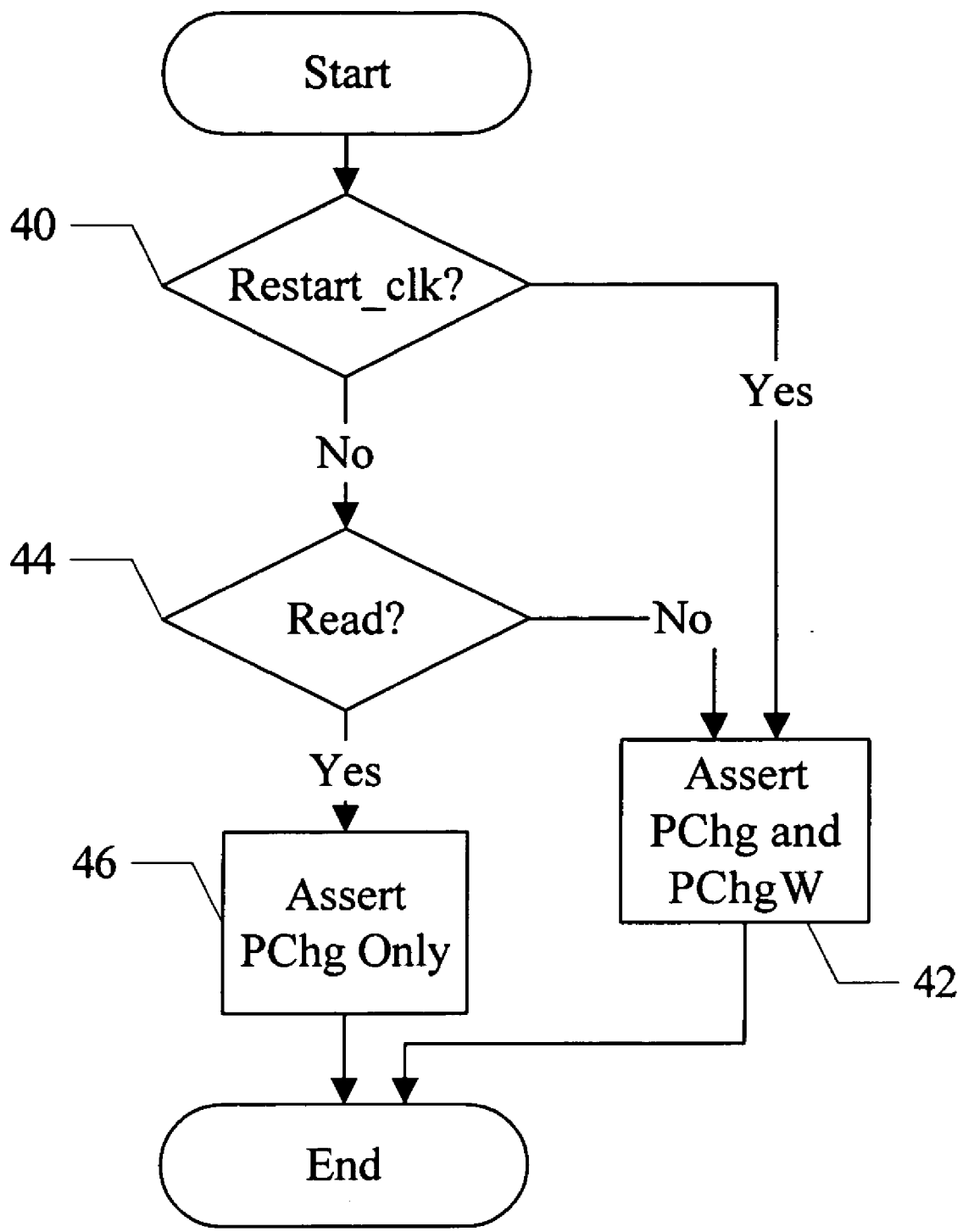
FIG. 4 is a flowchart illustrating operation of one embodiment of a precharge control circuit shown in FIG. 3.

Turning now to FIG. 4, a flowchart is shown illustrating operation of one embodiment of the precharge control circuit 20. While the blocks are shown in a particular order for ease of understanding in FIG. 4, other orders may be used. Blocks may be performed in parallel in combinatorial logic within the precharge control circuit 20. Blocks, combinations of blocks, or the flowchart as a whole may be pipelined over multiple clock cycles, in some embodiments.

If the restart clock signal is asserted (decision block 40, "yes" leg), the precharge control circuit 40 is configured to assert both the PChg and PChgW signals (block 42), thus activating both the bit line precharge circuit 34 and the bit line precharge-write circuit 36. The precharge control circuit 40 may assert both the PChg and PChgW signal independent of the operation interrupted by the stopped clock operation, if any. That is, the assertion may be independent of whether a read or write operation was interrupted, and even independent of whether or not an operation was interrupted at all.

If a read operation is performed (decision block 44, "yes" leg), the precharge control circuit 40 may assert only the PChg signal to activate the bit line precharge circuit 34 (block 46). If a write operation is performed (decision block 44, "no" leg), the precharge control circuit 40 may assert both the PChg signal and the PChgW signal (block 42).

In other embodiments, the bit line precharge-write circuit 36 may be designed to provide a precharge for a write operation without the bit line precharge circuit 34 being activated. In such embodiments, only the PChgW signal may be asserted at block 42.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a plurality of memory cells;
   a first bit line coupled to the plurality of memory cells and a second bit line coupled to the plurality of memory cells;
   a first bit line precharge circuit coupled to the first bit line and the second bit line, wherein the first bit line circuit is configured to precharge the first bit line and the second bit line;
   a second bit line precharge circuit coupled to the first bit line and the second bit line, wherein the second bit line circuit is configured to precharge the first bit line and the second bit line; and
   a control circuit coupled to the first bit line precharge circuit and the second bit line precharge circuit, wherein the control circuit is coupled to receive an indication that one or more clocks are being restarted after a period of stopped clock operation, and wherein the control circuit is configured to activate both the first bit line precharge circuit and the second bit line precharge circuit responsive to the indication and independent of an operation to the memory that was interrupted by the period of stopped clock operation, if any.

2. The apparatus as recited in claim 1 wherein the control circuit is configured to activate the first bit line precharge circuit and not activate the second bit line precharge circuit responsive to a read operation to one of the plurality of memory cells.

3. The apparatus as recited in claim 2 wherein the control circuit is configured to activate at least the second bit line precharge circuit responsive to a write operation to one of the plurality of memory cells.

4. The apparatus as recited in claim 3 wherein the control circuit is configured to activate both the first bit line precharge circuit and the second bit line precharge circuit responsive to the write operation.

5. An apparatus comprising:

a plurality of memory cells;

a first bit line coupled to the plurality of memory cells and a second bit line coupled to the plurality of memory cells;

a first bit line precharge circuit coupled to the first bit line and the second bit line, wherein the first bit line circuit is configured to precharge the first bit line and the second bit line responsive to a read operation to one of the plurality of memory cells;

a second bit line precharge circuit coupled to the first bit line and the second bit line, wherein the second bit line circuit is configured to precharge the first bit line and the second bit line; and a control circuit coupled to the first bit line precharge circuit and the second bit line precharge circuit, wherein the control circuit is coupled to receive an indication that a period of stopped clock operation is ending, and wherein the control circuit is configured to activate at least the second bit line precharge circuit responsive to the indication and even if a read operation was in progress at a start of the period of stopped clock operation.

6. The apparatus as recited in claim 5 wherein the control circuit is also configured to activate the first bit line precharge circuit in response to the indication.

7. The apparatus as recited in claim 5 wherein the control circuit, responsive to a write operation to one of the plurality of memory cells, is configured to activate at least the second bit line precharge circuit.

8. The apparatus as recited in claim 7 wherein the control circuit is also configured to activate the first bit line precharge circuit responsive to the write operation.

9. The apparatus as recited in claim 5 wherein the control circuit is configured to activate only the first bit line precharge circuit responsive to a read operation.

10. A method comprising:

ending a period of stopped clock operation; and activating both a first bit line precharge circuit and a second bit line precharge circuit to precharge a first bit line and a second bit line to which the first bit line precharge circuit is coupled and to which the second bit line precharge circuit is coupled responsive to the end of the period and independent of an operation that was interrupted at a start of the period of stopped clock operation, if any.

11. The method as recited in claim 10 further comprising:

performing a write operation to one of a plurality of memory cells to which the first bit line and the second bit line are coupled; and activating at least the second bit line precharge circuit responsive to the write operation.

12. The method as recited in claim 11 further comprising activating the first bit line precharge circuit responsive to the write operation.

13. The method as recited in claim 10 further comprising:

performing a read operation to one of a plurality of memory cells to which the first bit line and the second bit line are coupled; and activating the first bit line precharge circuit and not the second bit line precharge circuit responsive to the write operation.

* * * * *